United States Patent
Boettiger et al.

(10) Patent No.: US 7,696,588 B2
(45) Date of Patent: *Apr. 13, 2010

(54) MICROELECTRONIC IMAGERS WITH SHAPED IMAGE SENSORS AND METHODS FOR MANUFACTURING MICROELECTRONIC IMAGERS

(75) Inventors: Ulrich C. Boettiger, Boise, ID (US); Jin Li, Boise, ID (US); Steven D. Oliver, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 11/699,029

(22) Filed: Jan. 29, 2007

(65) Prior Publication Data

US 2007/0120212 A1    May 31, 2007

Related U.S. Application Data

(63) Continuation of application No. 11/061,034, filed on Feb. 18, 2005, now Pat. No. 7,190,039.

(51) Int. Cl.
*H01L 31/0232* (2006.01)
(52) U.S. Cl. .............................. 257/432; 257/E31.097
(58) Field of Classification Search ................ 257/680, 257/682, 687, 723, E27.133, E21.133, 234, 257/414, 431, 433–436; 438/25, 26, 27, 438/28, 64, 65, 106, 60, 75
See application file for complete search history.

(56) References Cited

U.S. PATENT DOCUMENTS

| | | | |
|---|---|---|---|
| 3,345,134 A | 10/1967 | Heymer at al. | |
| 4,534,100 A | 8/1985 | Lane | |
| 4,906,314 A | 3/1990 | Farnworth et al. | |
| 5,130,783 A | 7/1992 | McLellan | |
| 5,371,397 A | 12/1994 | Maegawa et al. | |
| 5,424,573 A | 6/1995 | Kato et al. | |
| 5,433,911 A * | 7/1995 | Ozimek et al. | 264/261 |
| 5,435,887 A | 7/1995 | Rothschild et al. | |
| 5,505,804 A | 4/1996 | Mizuguchi et al. | |
| 5,593,913 A | 1/1997 | Aoki | |

(Continued)

FOREIGN PATENT DOCUMENTS

EP    0 886 323    12/1998

(Continued)

OTHER PUBLICATIONS

U.S. Appl. No. 10/785,466, Kirby.

(Continued)

*Primary Examiner*—Brook Kebede
(74) *Attorney, Agent, or Firm*—Dickstein Shapiro LLP

(57) ABSTRACT

Microelectronic imagers with shaped image sensors and methods for manufacturing curved image sensors. In one embodiment, a microelectronic imager device comprises an imaging die having a substrate, a curved microelectronic image sensor having a face with a convex and/or concave portion at one side of the substrate, and integrated circuitry in the substrate operatively coupled to the image sensor. The imaging die can further include external contacts electrically coupled to the integrated circuitry and a cover over the curved image sensor.

19 Claims, 10 Drawing Sheets

U.S. PATENT DOCUMENTS

| | | | |
|---|---|---|---|
| 5,605,783 A | 2/1997 | Revelli et al. | |
| 5,672,519 A | 9/1997 | Song et al. | |
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |
| 5,877,040 A | 3/1999 | Park et al. | |
| 5,897,338 A | 4/1999 | Kaldenberg | |
| 5,914,488 A | 6/1999 | Sone | |
| 5,977,535 A | 11/1999 | Rostoker | |
| 5,998,862 A | 12/1999 | Yamanaka | |
| 6,002,163 A | 12/1999 | Wojnarowski | |
| 6,080,291 A | 6/2000 | Woodruff et al. | |
| 6,104,086 A | 8/2000 | Ichikawa et al. | |
| 6,114,240 A | 9/2000 | Akram et al. | |
| 6,143,588 A | 11/2000 | Glenn | |
| 6,165,813 A | 12/2000 | Quinn et al. | |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,064 B1 | 9/2001 | Foster | |
| 6,351,027 B1 | 2/2002 | Giboney et al. | |
| 6,372,548 B2 | 4/2002 | Bessho et al. | |
| 6,384,472 B1* | 5/2002 | Huang | 257/680 |
| 6,407,381 B1 | 6/2002 | Glenn et al. | |
| 6,411,439 B2 | 6/2002 | Nishikawa | |
| 6,455,931 B1* | 9/2002 | Hamilton et al. | 257/723 |
| 6,483,652 B2 | 11/2002 | Nakamura | |
| 6,486,541 B2 | 11/2002 | Usami et al. | |
| 6,503,780 B1 | 1/2003 | Glenn et al. | |
| 6,541,762 B2 | 4/2003 | Kang et al. | |
| 6,560,047 B2 | 5/2003 | Kim et al. | |
| 6,566,745 B1 | 5/2003 | Beyne et al. | |
| 6,603,183 B1 | 8/2003 | Hoffman | |
| 6,617,623 B2 | 9/2003 | Rhodes | |
| 6,661,047 B2 | 12/2003 | Rhodes | |
| 6,667,551 B2 | 12/2003 | Hanaoka et al. | |
| 6,670,986 B1 | 12/2003 | Ben Shoshan et al. | |
| 6,686,588 B1 | 2/2004 | Webster et al. | |
| 6,703,310 B2 | 3/2004 | Mashino et al. | |
| 6,864,172 B2 | 4/2004 | Noma et al. | |
| 6,734,419 B1 | 5/2004 | Glenn et al. | |
| 6,759,266 B1 | 7/2004 | Hoffman | |
| 6,774,486 B2 | 8/2004 | Kinsman | |
| 6,778,046 B2 | 8/2004 | Stafford et al. | |
| 6,791,076 B2 | 9/2004 | Webster | |
| 6,795,120 B2 | 9/2004 | Takagi et al. | |
| 6,797,616 B2 | 9/2004 | Kinsman | |
| 6,800,943 B2 | 10/2004 | Adachi | |
| 6,813,154 B2 | 11/2004 | Diaz et al. | |
| 6,825,458 B1 | 11/2004 | Moess et al. | |
| 6,828,545 B1 | 12/2004 | Hamilton et al. | |
| 6,828,663 B2 | 12/2004 | Chen et al. | |
| 6,828,674 B2 | 12/2004 | Karpman | |
| 6,844,978 B2 | 1/2005 | Harden et al. | |
| 6,874,227 B2 | 4/2005 | Hsin et al. | |
| 6,881,943 B1 | 4/2005 | Yegnashankaran | |
| 6,882,021 B2 | 4/2005 | Boon et al. | |
| 6,885,107 B2 | 4/2005 | Kinsman | |
| 6,934,065 B2 | 8/2005 | Kinsman | |
| 6,946,325 B2 | 9/2005 | Yean et al. | |
| 7,190,039 B2* | 3/2007 | Boettiger et al. | 257/432 |
| 2002/0006687 A1 | 1/2002 | Lam | |
| 2002/0057468 A1 | 5/2002 | Segawa et al. | |
| 2002/0089025 A1 | 7/2002 | Chou | |
| 2002/0096729 A1 | 7/2002 | Tu et al. | |
| 2002/0113296 A1 | 8/2002 | Cho et al. | |
| 2002/0145676 A1 | 10/2002 | Kuno et al. | |
| 2003/0062601 A1 | 4/2003 | Harnden et al. | |
| 2004/0012698 A1 | 1/2004 | Suda et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0082094 A1 | 4/2004 | Yamamoto | |
| 2004/0214373 A1 | 10/2004 | Jiang et al. | |
| 2004/0245649 A1 | 12/2004 | Imaoka | |
| 2005/0052751 A1 | 3/2005 | Liu et al. | |
| 2005/0104228 A1 | 5/2005 | Rigg et al. | |
| 2005/0110889 A1 | 5/2005 | Tuttle et al. | |
| 2005/0127478 A1 | 6/2005 | Hiatt et al. | |
| 2005/0151228 A1 | 7/2005 | Tanida et al. | |
| 2005/0236708 A1 | 10/2005 | Farnworth et al. | |
| 2005/0254133 A1 | 11/2005 | Akram et al. | |

FOREIGN PATENT DOCUMENTS

| | | |
|---|---|---|
| EP | 1 157 967 A2 | 11/2001 |
| EP | 1357605 A1 | 10/2003 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| JP | 2004349545 A | 12/2004 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.

Aachboun, S. And P. Ranson, "Deep anisotropic etching of silicon," J. Vac. Sci. Technol. A 17(4), Jul./Aug. 1999, pp. 2270-2273.

Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002 American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98(2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchlp.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UGI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager" 3 pages, EE Times, Jul. 18, 2003.

* cited by examiner

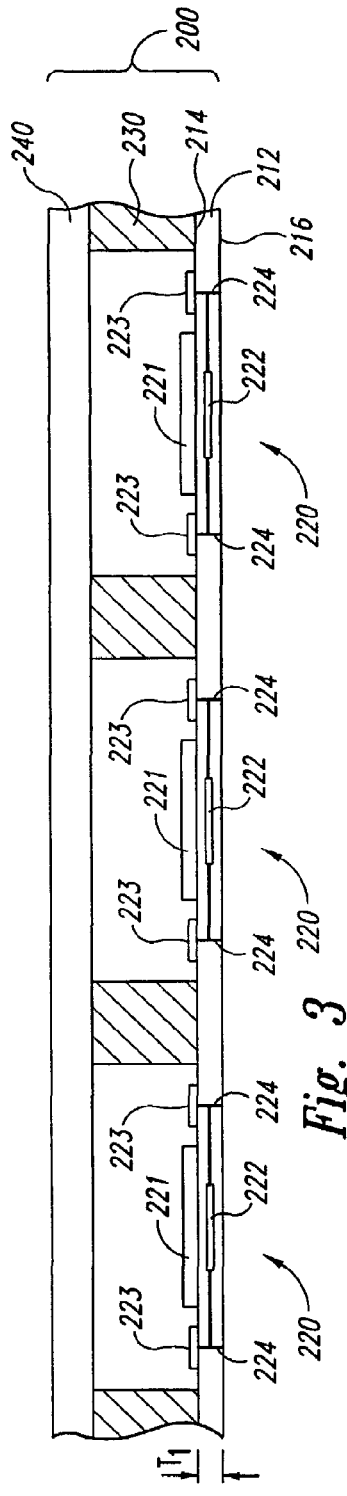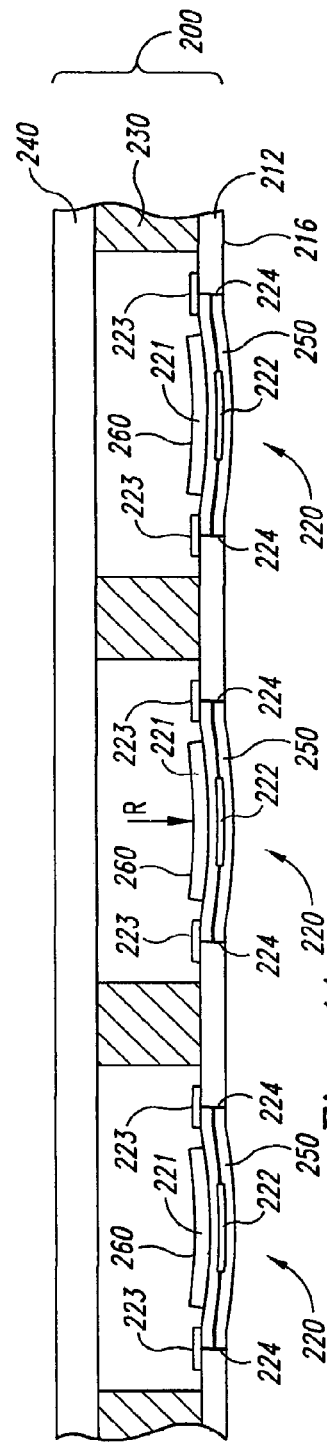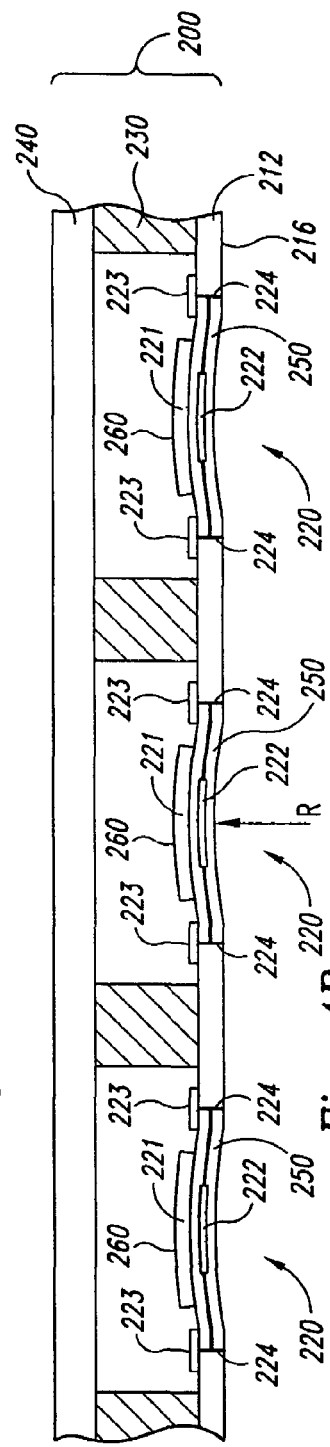

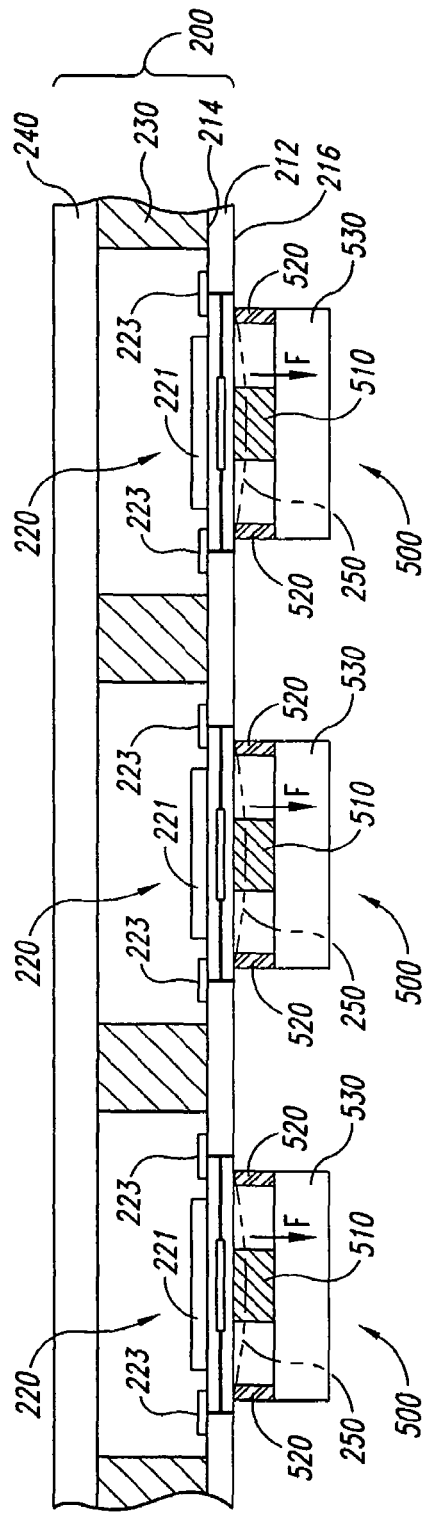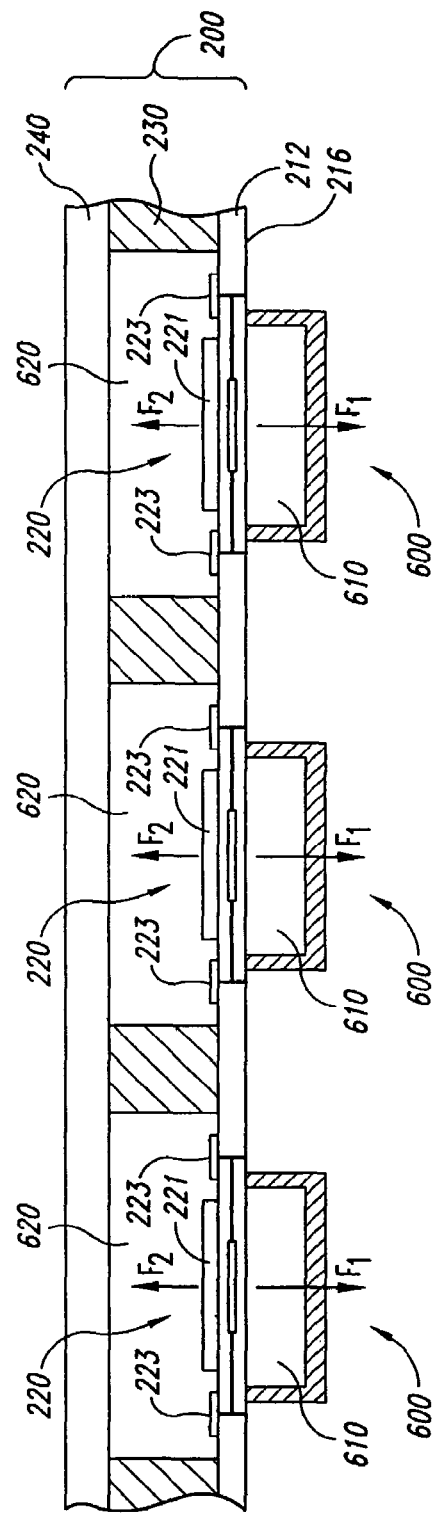

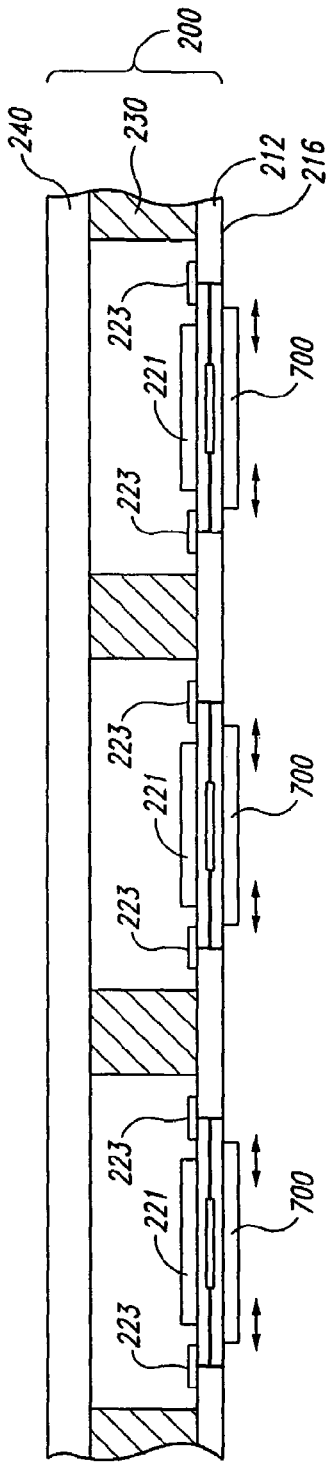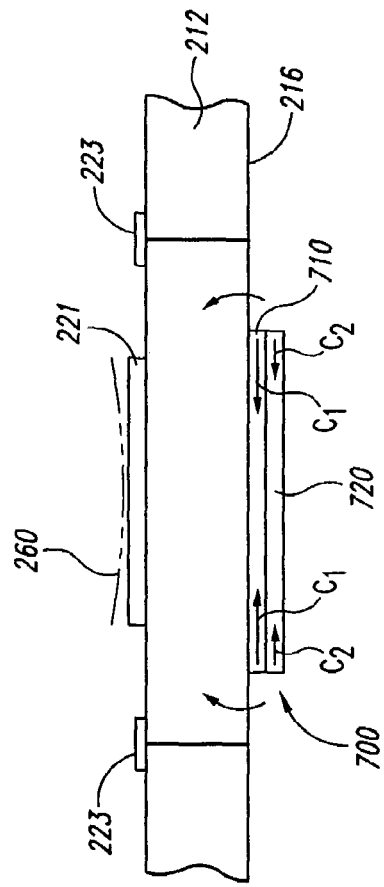

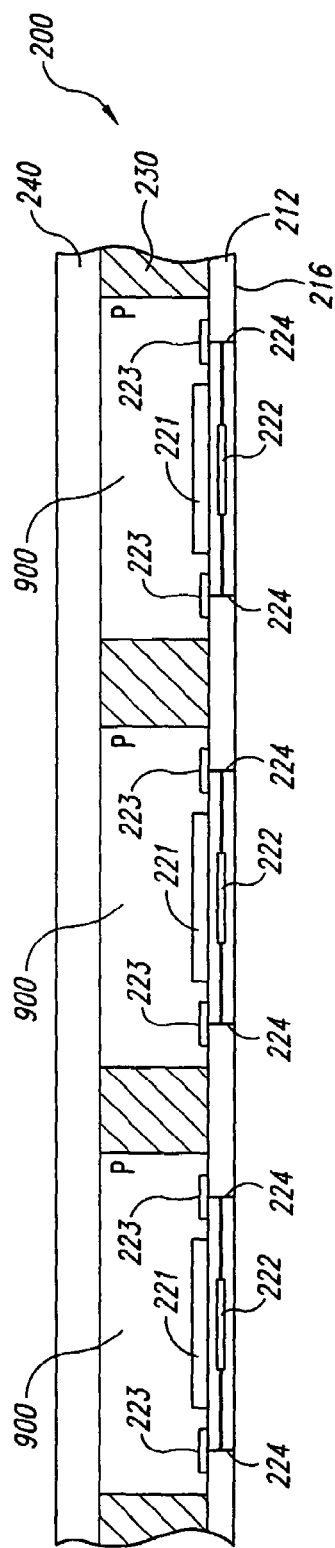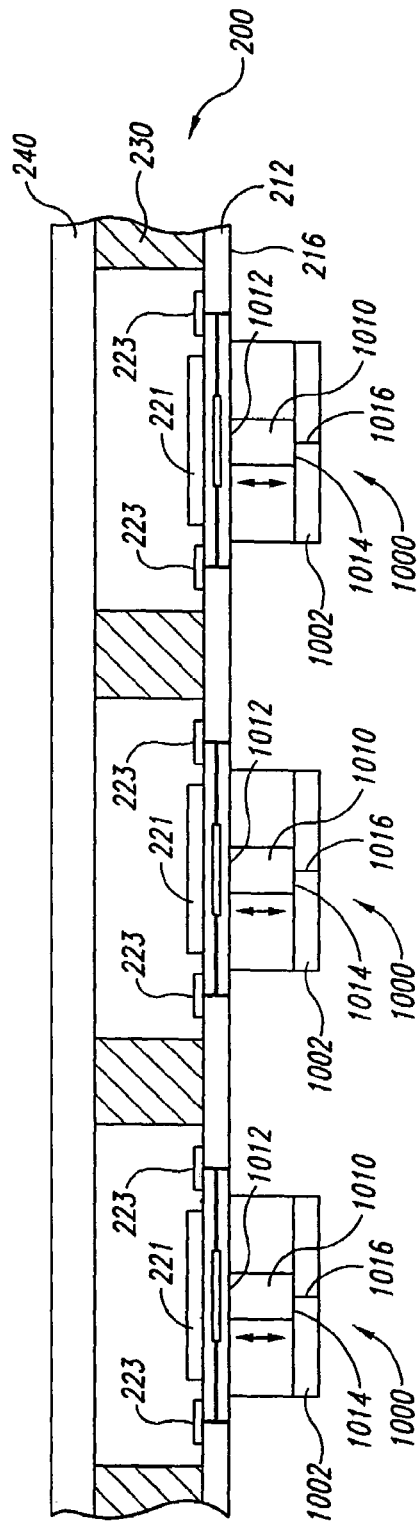

US 7,696,588 B2

MICROELECTRONIC IMAGERS WITH SHAPED IMAGE SENSORS AND METHODS FOR MANUFACTURING MICROELECTRONIC IMAGERS

CROSS-REFERENCE TO RELATED APPLICATION

This application is a continuation of U.S. patent application Ser. No. 11/061,034, filed on Feb. 18, 2005 now U.S. Pat. No. 7,190,039, the subject matter of which is incorporated in its entirety by reference herein.

TECHNICAL FIELD

The present invention generally relates to microelectronic imagers with shaped image sensors and methods for forming shaped image sensors for use in such microelectronic imagers.

BACKGROUND

Microelectronic imagers are used in digital cameras, wireless devices with picture capabilities, and many other applications. Cell phones and Personal Digital Assistants (PDAs), for example, incorporate microelectronic imagers for capturing and sending pictures. The growth rate of microelectronic imagers has been steadily increasing as they become smaller and produce better images with more pixels.

Microelectronic imagers include image sensors that use Charged Coupled Device (CCD) systems, Complementary Metal-Oxide Semiconductor (CMOS) systems, or other solid-state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect delicate components and to provide external electrical contacts.

FIG. 1 is a schematic side cross-sectional view of a conventional microelectronic imaging unit 1 including an imaging die 10, a chip carrier 30 carrying the die 10, and a cover 40 attached to the chip carrier 30 and positioned over the die 10. The imaging die 10 includes an image sensor 12 and a plurality of bond-pads 16 operably coupled to the image sensor 12. The chip carrier 30 has a base 32, sidewalls 34 projecting from the base 32, and a recess defined by the base 32 and sidewalls 34. The die 10 is received within the recess and attached to the base 32. The chip carrier 30 further includes an array of terminals 18 on the base 32, an array of contacts 24 on an external surface 38, and a plurality of traces 22 electrically connecting the terminals 18 to corresponding external contacts 24. The terminals 18 are positioned between the die 10 and the sidewalls 34 so that wire-bonds 20 can electrically couple the terminals 18 to corresponding bond-pads 16 on the die 10.

One problem with the microelectronic imaging unit 1 illustrated in FIG. 1 is that the die 10 must fit within the recess of the chip carrier 30. Dies having different shapes and/or sizes accordingly require chip carriers configured to house those specific types of dies. As such, manufacturing imaging units with dies having different sizes requires fabricating various configurations of chip carriers and significantly retooling the manufacturing process.

Another problem with conventional microelectronic imaging units is that they have relatively large footprints. For example, the footprint of the imaging unit 1 in FIG. 1 is the surface area of the base 32 of the chip carrier 30, which is significantly larger than the surface area of the die 10. Accordingly, the footprint of conventional microelectronic imaging units can be a limiting factor in the design and marketability of picture cell phones or PDAs because these devices are continually being made smaller in order to be more portable. Therefore, there is a need to provide microelectronic imaging units with smaller footprints.

The imager 1 shown in FIG. 1 also has an optics unit including a support 50 attached to the chip carrier 30 and a lens system with a plurality of lenses 70 (identified individually by reference numbers 70a-c). Traditional lens systems include a plurality of lenses for focusing the image at the image sensor 12. Traditional lens systems accordingly flatten the field of the image at the image sensor 12 so that the image is focused across the face of the image sensor 12. In the embodiment shown in FIG. 1, for example, the lens 70c may flatten the image "I" across the face of the image sensor 12. In other conventional systems, one or more of the lenses 70a-c can be combined into a single aspherical lens that can focus and flatten an image.

Another problem with conventional microelectronic imaging units is that lens systems with multiple lenses or more complex aspherical lenses are relatively tall and complex. Conventional lens systems accordingly have high profiles, can be expensive to manufacture, and may be difficult to assemble. Therefore, it would be desirable to reduce the demands and complexity of lens systems in the manufacturing of microelectronic imagers.

BRIEF DESCRIPTION OF THE DRAWINGS

FIG. 3 is a cross-sectional view illustrating a subsequent stage of fabricating a plurality of microelectronic imagers at the wafer level in accordance with an embodiment of the invention.

FIGS. 4A and 4B are schematic side cross-sectional views illustrating alternative embodiments of microelectronic imagers fabricated in accordance with an embodiment of the invention.

FIG. 5 is a cross-sectional view illustrating an embodiment for forming curved image sensors in microelectronic imagers in accordance with an embodiment of the invention.

FIG. 6 is a cross-sectional view illustrating an embodiment for forming curved image sensors in microelectronic imagers in accordance with another embodiment of the invention.

FIG. 7 is a cross-sectional view illustrating an embodiment for forming curved image sensors in microelectronic imagers in accordance with another embodiment of the invention.

FIG. 8 is a cross-sectional view illustrating a process for bending a substrate to fabricate curved microelectronic imagers in accordance with a specific embodiment of the method shown in FIG. 7.

FIG. 9 is a cross-sectional view illustrating another embodiment for fabricating curved image sensors in accordance with the invention.

FIG. 10 is a cross-sectional view illustrating a device and method for fabricating curved image sensors in accordance with still another embodiment of the invention.

DETAILED DESCRIPTION

A. Overview

Figure 1:
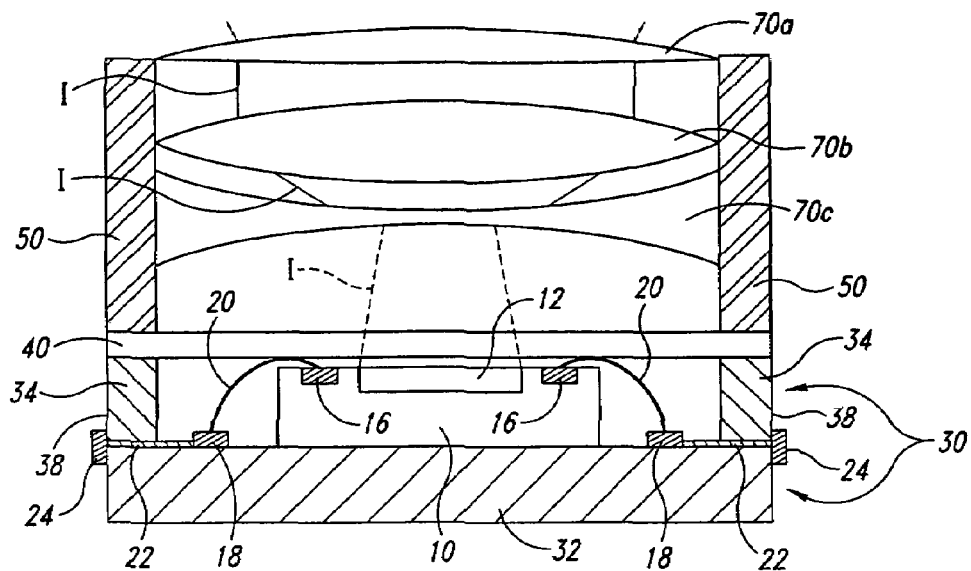
FIG. 1 is a schematic side cross-sectional view of a packaged microelectronic imager in accordance with the prior art.

The following disclosure describes several embodiments of microelectronic imagers having shaped image sensors and methods for fabricating such microelectronic imagers at the wafer level and at the individual die level. In one embodiment, a microelectronic imager device comprises an imaging die having a substrate, a curved microelectronic image sensor having a convex and/or concave face at one side of the substrate, and integrated circuitry in the substrate operatively coupled to the image sensor. The imaging die can further include external contacts electrically coupled to the integrated circuitry and a cover over the curved image sensor. In particular embodiments, the curved image sensor mitigates the extent that images need to be flattened so that the images can be focused at the peripheral regions of the image sensor.

The curved microelectronic image sensor can have a convex and/or concave face with a desired radius of curvature. For example, the curved image sensor can have a face with a single radius of curvature, a plurality of curves with different radii, and/or flat portions in combination with one or more curves. The curved face of the image sensor is expected to receive a generally spherical image field such that the lens assembly does not need to significantly flatten the field to compensate for a planar sensor array.

In an alternative embodiment, a microelectronic imager device includes an imaging die having a substrate with a bowed portion, a microelectronic image sensor having a curved face at the bowed portion of the substrate, and integrated circuitry electrically coupled to the image sensor. The imager device can further include a flexor unit that exerts a force against the substrate to bend or otherwise flex the substrate to form the bowed portion under the image sensor. The flexor unit, for example, can include a first element attached to a first region of the substrate under an image sensor, a spacer attached to the substrate outwardly of the first element, and a plate attached to the first element and the spacer. The first element expands or contracts more or less than the spacer to flex the substrate. The flexor unit can alternatively comprise a compartment at the front side and/or the backside of the substrate and a fluid in the compartment at a pressure that causes the substrate to bow. Another embodiment of the flexor unit can comprise a material attached to the backside of the substrate that bends the substrate into a desired curvature. The flexor unit can alternatively comprise an actuator attached to the backside of the substrate to flex the substrate and bend the image sensor into a desired curvature.

Another aspect of the invention is a method for manufacturing microelectronic imager devices. In one embodiment, such a method includes constructing an imaging die having a substrate, integrated circuitry in the substrate, and an image sensor having a curved face at one side of the substrate. This method can further include positioning a cover over the substrate and/or bending the substrate to flex the image sensor.

Another aspect of the invention is directed toward a microelectronic imager device including an imaging die comprising a substrate having a front side and a backside, a microelectronic image sensor having a face located at the front side of the substrate, and integrated circuitry connected to the image sensor. The imager device further includes a backing member including a shaped surface. In several embodiments, a portion of the backside of the substrate is attached to the shaped surface of the backing member such that the face of the image sensor is curved or otherwise contoured at least generally in the shape of the shaped surface.

Another aspect of the invention is directed toward a microelectronic imager device assembly. In one embodiment, the imager device assembly includes a substrate and a backing member. The substrate has a front side, a backside, and a plurality of imaging dies arranged in a die pattern. The individual imaging dies comprise a microelectronic image sensor located at the front side of the substrate and integrated circuitry electrically coupled to the image sensor. The substrate accordingly has a plurality of discrete image sensors and integrated circuits. The backing member includes a plurality of curved surfaces arranged in the die pattern. Individual curved surfaces are aligned with a corresponding image sensor and attached to the backside of the substrate. Several embodiments of the imager device assembly accordingly have curved image sensors corresponding to the shape of the curved surfaces of the backing member.

Another aspect of the invention is directed toward a method of manufacturing microelectronic imager devices. One embodiment of such a method includes providing a substrate having a front side, a backside, and a plurality of imaging dies arranged in a die pattern. The imaging dies comprise microelectronic image sensors located at the front side of the substrate and integrated circuitry electrically coupled to the image sensors. The method further includes providing a backing member comprising a plurality of curved surfaces arranged in the die pattern, and attaching the curved surfaces to the backside of the substrate such that the curved surfaces are aligned with corresponding image sensors.

Another embodiment of a method for manufacturing microelectronic imager devices comprises providing a substrate having a front side, a backside, and a plurality of imaging dies arranged in a die pattern. The imaging dies have image sensors and integrated circuitry connected to corresponding image sensors. The method further includes providing a mold having a plurality of shaped molding sites arranged in the die pattern, and conforming the imaging dies to the shaped molding sites to bend the image sensors to a desired curvature.

Several details of specific embodiments of the invention are described below with reference to CMOS imagers to provide a thorough understanding of these embodiments. CCD imagers or other types of sensors, however, can be used instead of CMOS imagers in other embodiments of the invention. Several details describing well-known structures often associated with microelectronic devices may not be set forth in the following description for the purposes of brevity. Moreover, other embodiments of the invention can have different configurations or different components than those described and shown in this section. As such, other embodiments of the invention may have additional elements or may not include all the elements shown and described below with reference to FIGS. 2-16.

B. Microelectronic Imagers with Curved Image Sensors

Figure 2:
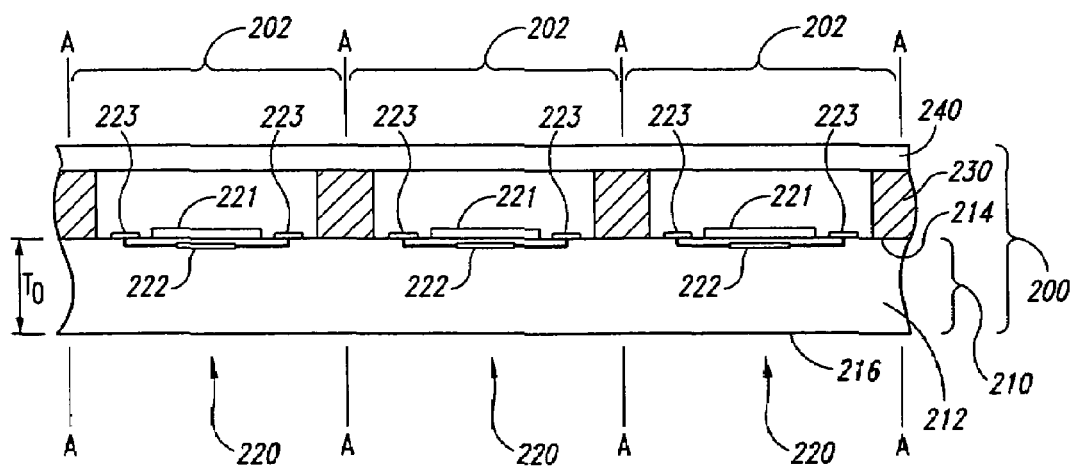
FIG. 2 is a cross-sectional view illustrating one stage of fabricating a plurality of microelectronic imagers at the wafer level in accordance with an embodiment of the invention.

FIG. 2 is a side cross-sectional view illustrating an imager unit assembly 200 having a plurality of microelectronic imager units 202 at one stage of a method for packaging imagers in accordance with an embodiment of the invention. The assembly 200 illustrated in FIG. 2 includes an imager workpiece 210, standoffs 230 projecting from the imager workpiece 210, and a cover 240 attached to the standoffs 230. A plurality of optics units (not shown) are typically mounted to the cover 240 either before or after forming curved image sensors on the imager workpiece 210 to fabricate microelectronic imagers.

The imager workpiece 210 includes a substrate 212 having a front side 214, a backside 216, and an initial thickness $T_0$ to between the front side 214 and backside 216. The imager workpiece 210 further includes a plurality of imaging dies 220 formed on and/or in the substrate 212. Individual imaging dies 220 can include an image sensor 221, integrated circuitry 222 operatively coupled to the image sensor 221, and terminals 223 (e.g., bond-pads) electrically coupled to the integrated circuitry 222. The image sensors 221 can be CMOS devices, CCD image sensors, or other solid state devices for capturing pictures in the visible spectrum or sensing radiation in other spectrums (e.g., IR or UV ranges). As explained in more detail below, the terminals 223 can be connected to through-wafer interconnects formed according to the processes disclosed in U.S. patent application Ser. No. 10/713,878 entitled "-Methods for Forming Vias in Microelectronic Devices, and Methods for Packaging Microelectronic Devices," filed on Nov. 13, 2003, which is incorporated by reference herein in its entirety. Other embodiments of external contacts can include terminals that are at an intermediate depth within the first substrate 212 instead of being at the front side 214.

The embodiment of the imager unit assembly 200 illustrated in FIG. 2 is fabricated at the wafer level such that several imaging units 202 are packaged before singulating (e.g., cutting) the first substrate 212, the spacers 230 and the cover 240 along lines A-A. One aspect of wafer-level packaging is using automated equipment to further process the assembly 200 to form curved image sensors and to install optics units (not shown) onto the cover 240. FIGS. 3-4B illustrate several aspects of forming curved image sensors and embodiments of assemblies having curved image sensors.

FIG. 3 illustrates the imager unit assembly 200 at a subsequent stage of a process for forming curved image sensors on the imaging dies 220. At this stage of the process, the substrate 212 has been thinned from the initial thickness $T_0$ to a thickness $T_1$ so that the portions of the substrate 212 between the standoffs 230 are at least relatively flexible. In several embodiments, the substrate 212 can be thinned using a back grinding process, a chemical-mechanical planarization process, and/or an etching procedure known in the art to form a new backside 216. The final thickness $T_1$ between the front side 214 and the backside 216 can be in the range of approximately 20-200 μm depending upon the type of material. When the substrate 212 is composed of silicon, the thickness $T_1$ is generally less than approximately 150 μm and can be in the range of approximately 20-80 μm. The very thin portions of the substrate 212 between the standoffs 230 acts much like a flexible membrane, and as such the portions of the substrate 212 under the image sensors 221 can be flexed to bend the image sensors 221. After thinning the substrate, the assembly 200 illustrated in FIG. 3 can be further processed to construct the through-wafer interconnects 224 through the substrate 212 to provide electrical contacts on the backside 216 of the substrate 212. Additional suitable processes for forming such interconnects are disclosed in U.S. application Ser. No. 10/879,838, entitled "Microelectronic Devices and Methods for Forming Interconnects in Microelectronic Devices," filed on Jun. 29, 2004, which is herein incorporated by reference.

FIG. 4A is a cross-sectional view illustrating one embodiment of the imager unit assembly 200 after bending the substrate 212 to form curved image sensors 221. In this embodiment, the substrate 212 has curved portions 250 in the areas aligned with the image sensors 221. The curved portions 250 are generally discrete bowed regions of the substrate 212 that form projecting bumps on the backside 216. In one embodiment, the curved portions 250 have a shape of a portion of a sphere with a radius of curvature R. The curved portions 250 are not limited to a spherical configuration and can have other configurations with one or more curves and/or flat portions depending upon the particular application.

The image sensors 221 flex as the curved portions 250 of the substrate 212 are formed such that the image sensors 221 have curved faces 260. The curvature of each curved face 260 is configured so that the array on the curved face 260 is at a desired focal distance for the image. In the embodiment illustrated in FIG. 4A, the curved image sensors 221 have concave curved faces 260 relative to the direction of the radiation to accommodate non-planar image fields.

The curved image sensors 221 with the curved faces 260 are expected to (a) reduce the complexity of fabricating lens systems and (b) increase the options of lens systems that can be used with the imagers. For example, because the image sensors 221 have curved faces 260, the image field does not need to be flattened using optics to the same extent as image fields need to be flattened for planar image sensors. This is expected to eliminate the need for field flattening lenses in the optics units that are attached to the cover 240, or at least reduce the complexity of field flattening lenses. Therefore, the imaging dies 220 illustrated in FIG. 4A reduce the constraints on lens designs such that fewer lenses or less complex lenses can be used to reduce the cost of fabricating microelectronic imagers.

The curved image sensors 221 illustrated in FIG. 4A are also advantageous because they are particularly well-suited for miniature camera applications that require a wide-angle field of view and/or have a short focal distance. One problem with miniature cameras is that it is difficult to adequately flatten the image field because the focal distance between the lenses and the image sensors 221 is extremely short. As a result, images from conventional miniature cameras are typically focused at the center but out of focus at the periphery. The curved image sensors 221 mitigate this problem because the periphery of the image sensors 221 is at, or at least closer to, the desired focal distance of the image field. The curved image sensors 221 are also expected to be very useful for megapixel wide-angle applications that have longer focal distances for the same reason. Therefore, the curved image sensors 221 are further expected to provide better quality images for miniature cameras or other applications that have a wide-angle field of view.

FIG. 4B is a cross-sectional view illustrating another embodiment of the imager unit assembly 200 having a plurality of imaging dies 220 with curved image sensors 221. In this embodiment, the curved portions 250 of the substrate 212 project into the cavity between the cover 240 and the substrate 212. The curved portions 250 accordingly form small discrete dimples on the backside 216 of the substrate 212 such that the image sensors 221 have convex curved faces 260 relative to the direction of the radiation. As described above, the curved portions 250 can have the shape of a portion of a sphere having a radius of curvature R, but other configurations may also be suitable.

C. Methods and Devices for Forming Curved Image Sensors

FIG. 5 is a cross-sectional view of an embodiment of fabricating curved image sensors using a plurality of flexor units 500 attached to the backside 216 of the substrate 212. The flexor units 500 can be positioned at each imaging die 220 or only at known-good imaging dies 220 depending upon the particular application. The individual flexor units 500 include a first element 510 attached to the backside 216 of the substrate 212 under a corresponding image sensor 221. The first elements 510, for example, can be expansion/contraction members attached to the substrate 212 at areas aligned with the central regions of the corresponding image sensors 221. The individual flexor units 500 can further include a spacer 520 arranged outwardly from the first element 510 and a plate 530 attached to the first element 510 and the spacer 520. In one embodiment, the first elements 510 are made from a material having a first coefficient of thermal expansion, and the spacers 520 are made from a material having a second coefficient of thermal expansion less than that of the first elements 510. In other embodiments, the first elements 510 can be a shape memory metal, such as Nitinol, and the spacers 520 can be a substantially incompressible material.

The flexor units 500 operate by expanding/contracting the first elements 510 either more or less than the spacers 520 to bend the substrate 212 in the local regions under corresponding image sensors 221. For example, the flexor units 500 can be attached to the substrate 212 at an elevated temperature, and then the assembly can be cooled such that the first elements 510 exert local forces (arrows F) that bend the substrate 212 into the concave curved portions 250 (shown in dashed lines) similar to those shown in FIG. 4A. The spacers 520 in this example contract less than the first elements 510 as they cool. Alternatively, the first elements 510 can have a lower coefficient of thermal expansion than the spacers 520 such that the first element 510 exerts a force in the opposite direction to form convex curved portions similar to those illustrated in FIG. 4B.

FIG. 6 is a cross-sectional view illustrating another embodiment for fabricating curved image sensors in microelectronic imagers using a plurality of flexor units 600 attached to the backside 216 of the substrate 212 under corresponding imaging dies 220. In this embodiment, individual flexor units 600 include a, compartment 610 and a fluid in the compartment 610 at a pressure that causes the substrate 212 to bow (not shown in FIG. 6) in a manner that flexes a corresponding image sensor 221. In one embodiment, the compartments 610 can be attached to the substrate 212 in a low pressure environment such that the pressure inside the compartments 610 is less than the pressure in chambers 620 over the corresponding image sensors 221. The pressure differential between the compartments 610 and the chambers 620 exerts a force. $F_1$ that draws the portions of the substrate 212 under the image sensors 221 into the compartments 610 to form curved portions (not shown) similar to the concave curved portions 250 illustrated above with respect to FIG. 4A. Alternatively, the compartments 610 can be attached to the substrate 212 in a high pressure environment such that the pressure in the compartments 610 is greater than the pressure in the chambers 620. This second embodiment exerts a force $F_2$ against the substrate 212 to drive the portions of the substrate 212 under the image sensors 221 into the chambers 620 to form a convex curvature on the image sensors 221 as illustrated above with respect to FIG. 4B. The pressure in the compartments 610 can also be set by vacuuming or pressurizing the compartments 610 using gas or fluid lines connected to the compartments 610.

FIG. 7 is a cross-sectional view illustrating yet another embodiment for forming curved image sensors on the assembly 200 using flexor units 700 attached to the backside 216 of the substrate 212 underneath corresponding image sensors 221. In this embodiment, the flexor units 700 can be a material that expands or contracts in a manner that bends the portions of the substrate 212 under the image sensors 221 into a concave and/or convex curvature. The flexor units 700, for example, can be an epoxy deposited onto the backside 216 of the substrate 212 and then cured in a manner that causes the epoxy to contract. As the epoxy contracts, it is expected to bend the substrate 212 to form convex curved portions similar to those illustrated above with respect to FIG. 4B. The epoxy can be deposited in many configurations, including a circle, radial starburst pattern, or other suitable pattern. The flexor units 700 can alternatively be small members of a shape memory alloy that assumes a desired configuration when it is in an operating temperature range. For example, the shape memory alloy may be attached to the substrate 212 at a first temperature and then expand, contract or otherwise flex as it reaches an operating temperature range to bend the local regions of the substrate 212 under the image sensors 221 in a manner that forms concave and/or convex portions similar to those illustrated above with respect to FIG. 4A or 4B.

FIG. 8 is a cross-sectional view illustrating yet another embodiment of a flexor unit 700 having a first material 710 and a second material 720. The first material 710 typically has a higher coefficient of thermal expansion than the second material 720. As such, when the flexor 700 cools to an operating temperature range, the first material 710 contracts by a greater extent (arrows $C_1$) than the second material 720 (arrows $C_2$). The difference in contraction is expected to cause the flexor unit 700 to exert a downward force against the substrate 212 to form a concave curved face 260 (illustrated in dashed lines), as illustrated above with respect to FIG. 4A. In one embodiment, the first layer 710 can be composed of aluminum and the second layer 720 can be composed of Kovar to form a bimetallic plate.

FIG. 9 illustrates another embodiment for bending the image sensors 221 to have curved faces with a desired curvature. In this embodiment, flexor units 900 are defined by sealed chambers over the image sensors 221 and a fluid in the sealed chambers at a pressure P. The pressure of the fluid causes the substrate 212 to flex in the regions under the image sensors 221 as shown in FIGS. 4A and 4B. In one embodiment, the cover 240 is assembled to the standoffs 230 in an environment at a pressure higher than ambient pressure such that the pressure in the sealed chambers drives the portions of the substrate 212 under the image sensors 221 outwardly to form the concave faces on the image sensors as illustrated in FIG. 4A. In an alternative embodiment, the cover 240 is assembled to the spacers 230 in an environment at a pressure lower than the ambient temperature such that the substrate 212 is drawn into the compartments to form convex curved faces on the image sensors as illustrated in FIG. 4B.

FIG. 10 illustrates another embodiment for bending the image sensors into a desired curvature in accordance with the invention using a plurality of flexor units 1000 attached to the backside of the substrate 212 under corresponding image sensors 221. In this embodiment, the individual flexor units 1000 include a bracket 1002 attached to the backside 216 of the substrate 212 and an actuator 1010 attached to the bracket 1002. The actuator 1010 can have a first end 1012 in contact with the backside 216 of the substrate 212 underneath a central portion of a corresponding image sensor 221. The actuator 1010 can further include a second end 1014 attached to the bracket 1002 and a line 1016 for transmitting electrical signals or carrying fluids to control the actuator 1010. In one embodiment, the actuator 1010 is a piezoelectric element and the line 1016 is an electrically conductive wire that can be coupled to a control unit. In a different embodiment, the actuator can be a bladder or other type of structure that can be expanded/contracted by adjusting a fluid pressure. In still another embodiment, the actuator 1010 can be a pneumatic or hydraulic cylinder. In operation, the actuator 1010 moves upwardly to form a convex curved face on the image sensor 221 (see FIG. 4B) or downwardly to form a concave curved face on the image sensor 221 (see FIG. 4A). The actuators 1010 can also be operated in real time while using an imaging unit to provide fine adjustment of the focus for wide-angle applications and other applications.

Figure 11:
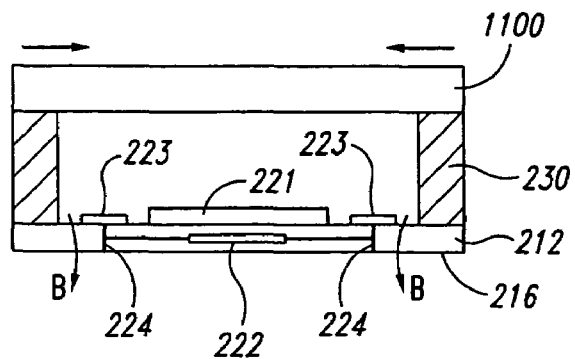
FIG. 11 is a cross-sectional view illustrating a device and method for fabricating curved image sensors in accordance with yet another embodiment of the invention.

FIG. 11 illustrates still another embodiment for bending the image sensors into a desired curvature. In this embodiment, a flexor unit 1100 is defined by a transparent cover attached to the standoff 230 at an elevated temperature. The transparent flexor unit 1100 has a coefficient of thermal expansion greater than that of the substrate 212 such that the flexor unit 1100 contracts more than the substrate 212 as the assembly is cooled. The corresponding contraction of the flexor unit 1100 causes the substrate 212 to bend as shown by arrows B to form a concave curved face on the image sensor 221 as shown above with respect to FIG. 4A.

Figure 12A:
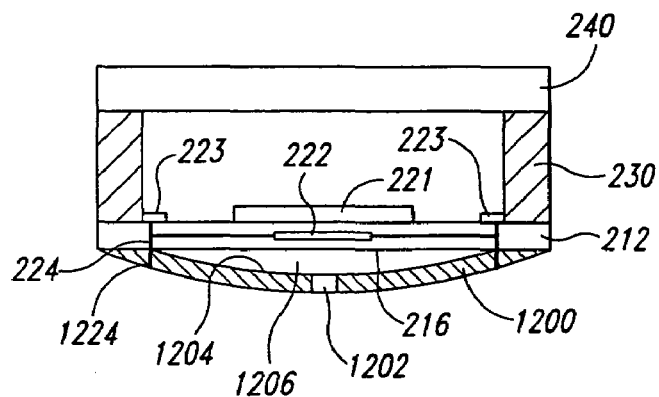
FIGS. 12A and 12B are cross-sectional views illustrating a device and a process for fabricating curved image sensors in accordance with an embodiment of the invention.
Figure 12B:
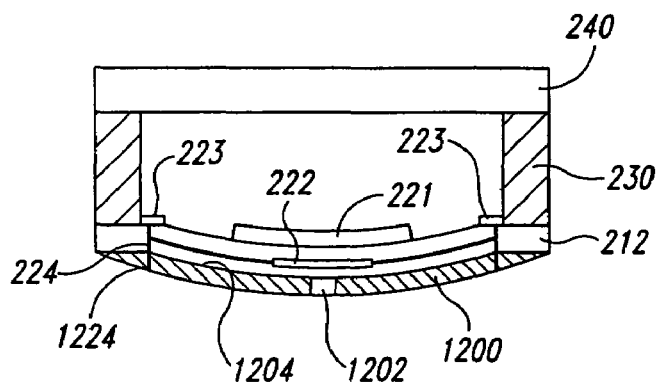

FIGS. 12A and 12B are cross-sectional views that illustrate still another embodiment for bending the image sensors into a desired curvature in accordance with the invention using curved flexor units 1200 attached to the backside of the substrate 212. The flexor units 1200 are vacuum cups having an opening 1202 and an interior surface 1204 with a curvature corresponding to the desired curvature for the image sensors 221. FIG. 12A illustrates the process before the substrate 212 is bent to form the curved face on the image sensor 221. At this stage, there is a gap 1206 between the backside 216 of the substrate 212 and the interior surface 1204 of the flexor unit 1200. To bend the substrate 212, a vacuum is drawn through the opening 1202. Referring to FIG. 12B, the vacuum drawn through the opening 1202 draws the backside 216 of the substrate 212 against the interior surface 1204 of the flexor unit 1200. The backside 216 of the substrate 212 and/or the interior surface 1204 of the flexor unit 1200 can be covered with an adhesive that adheres the backside 216 of the substrate 212 to the interior surface 1204 of the flexor unit 1200. The flexor unit 1200 can further include interconnects 1224 that contact the interconnects 224 to carry the backside electrical contacts from the substrate 212 to the exterior surface of the flexor unit 1200.

FIGS. 13A-13D illustrate various stages of an embodiment for manufacturing microelectronic imager devices at the wafer-level. The processes illustrated in FIGS. 13A-13D are similar to the embodiment illustrated in FIGS. 12A-B and can use the assembly 200 illustrated in FIG. 3. Therefore, like reference characters refer to like components in FIGS. 3, 12A-B, and 13A-D.

Figure 13A:
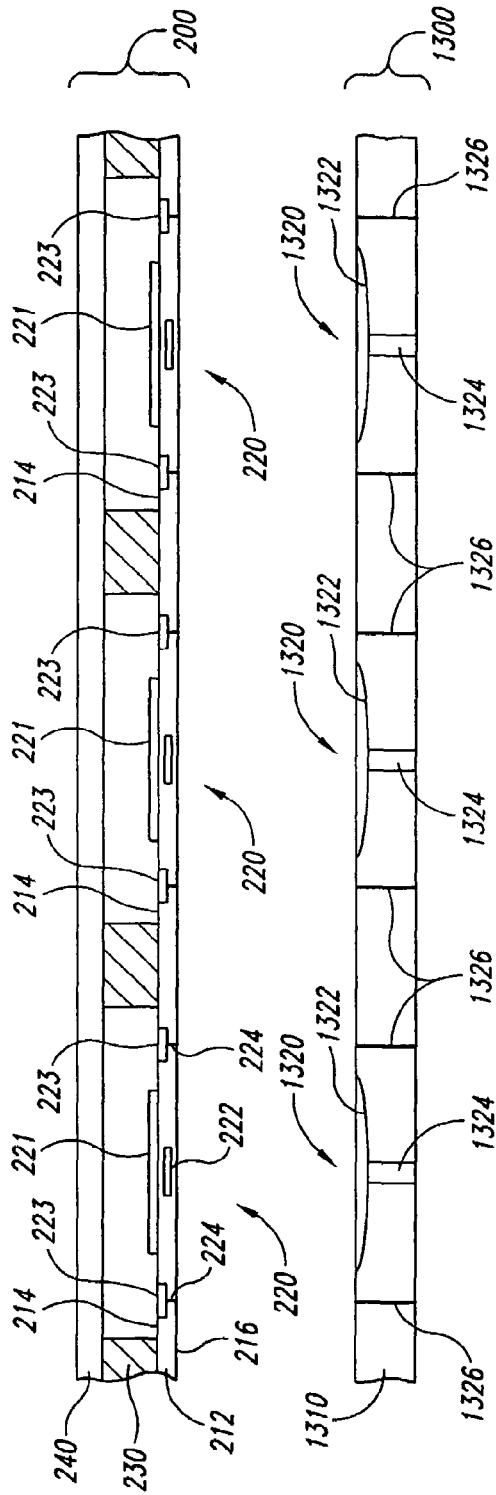
FIGS. 13A-13D are cross-sectional views illustrating stages of fabricating microelectronic imager devices with curved image sensors in accordance with another embodiment of the invention.

FIG. 13A is a cross-sectional view illustrating an, early stage of a method for manufacturing a plurality of microelectronic imager devices at the wafer-level. At this stage, the assembly 200 is aligned with a backing member 1300 such that the substrate 212 faces a plate 1310 of the backing member 1300. The plate 1310 can be a mold having a plurality of flexor units 1320. The individual flexor units 1320 can be molding units similar to the flexor units 1200 described above with respect to FIGS. 12A-B. In this embodiment, the flexor units 1320 include shaped surfaces 1322 defined by depressions or concave areas along the plate 1310. The shaped surfaces 1322 can be curved surfaces that have a curvature corresponding at least generally to the desired curvature for the image sensors 221. The flexor units 1320 can further include one or more openings 1324 terminating at the shaped surfaces 1322 and interconnects 1326 corresponding to the through-wafer interconnects 224 of the imaging dies 226- described above. The flexor units 1320 illustrated in FIG. 13A are arranged in a pattern corresponding to the pattern of the imaging dies 220 on the assembly 200 such that each imaging die 220 can be attached to a corresponding flexor unit 1320.

Figure 13B:
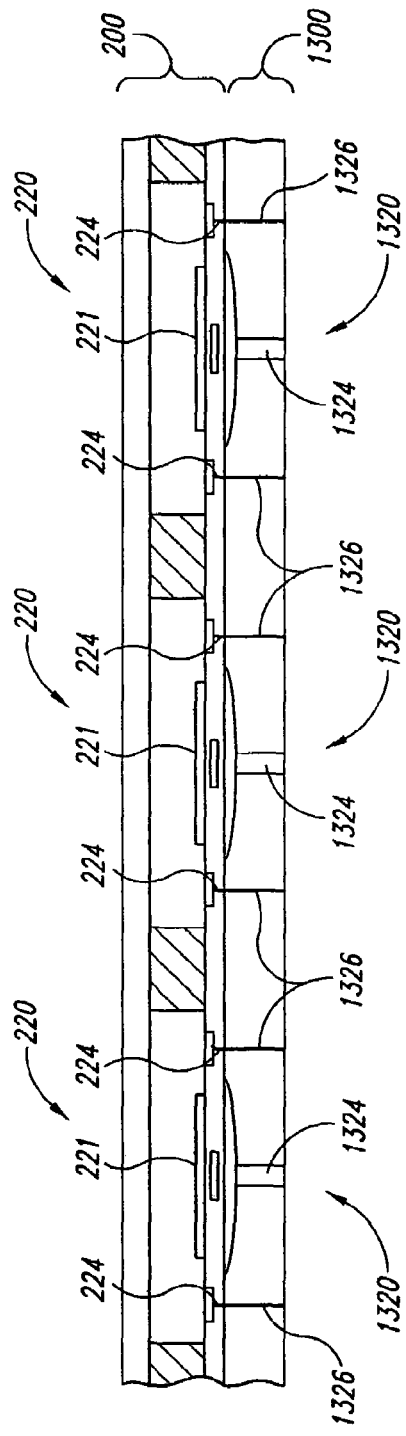
Figure 13C:
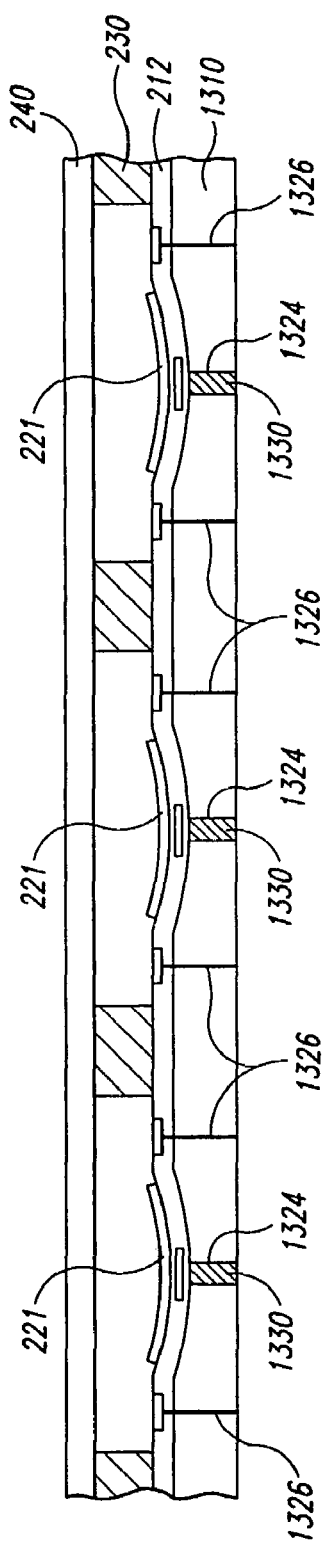

FIGS. 13B and 13C are cross-sectional views illustrating subsequent stages of constructing imager devices in accordance with aspects of this embodiment of the invention. FIG. 13B illustrates a stage at which the assembly 200 has been mounted to the backing member 1300 such that the image sensors 221 are aligned with the shaped surfaces 1322 and the through-wafer interconnects 224 are engaged with the interconnects 1326. The image sensors 221 are accordingly aligned with molding sites defined by the shaped surfaces 1322. FIG. 13C illustrates a later stage at which the imaging dies 220 have been shaped to at least generally conform the image sensors 221 to the shaped surfaces 1322. The imaging dies 220, more specifically, can be bent in discrete regions of the substrate 212 to conform the image sensors 221 to the shaped surfaces 1322. In one embodiment, the shaped surfaces 1322 and openings 1324 comprise vacuum cups, and the discrete regions of the substrate 212 are drawn against the shaped surfaces 1322 by reducing the pressure in the vacuum cups until the substrate 212 adequately conforms to the shaped surfaces 1322. The backside of the substrate 212 or the shaped surfaces 1322 can be coated with an adhesive to bond the substrate 212 to the shaped surfaces 1322. The openings 1324 can then be filled with a plug 1330 to protect the backside of the substrate 212.

Figure 13D:
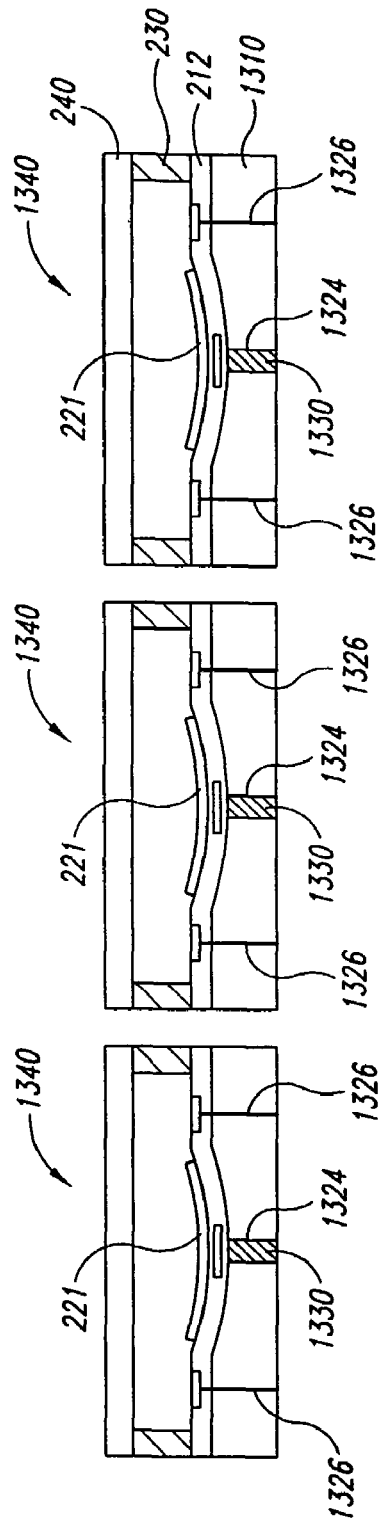

FIG. 13D is a cross-sectional view illustrating a later stage of forming a plurality of microelectronic imager devices 1340 in accordance with an aspect of this embodiment of the invention. At the stage illustrated in FIG. 13D, the cover 240, substrate 212, and plate 1310 are cut in the regions between the imaging dies 220 to separate the individual imager devices 1340 from one another. The procedure illustrated in FIG. 13D can have one or more cutting steps to cut through the various components. For example, the cover 240 and substrate 212 can be cut using one type of blade set, and the plate 1310 can be cut using a different blade set. In other embodiment, the cover 240 and a significant portion of the spacer 230 can be cut with a first blade, the substrate 212 can be cut with a second blade that is thinner than the first blade, and the plate 1310 can be cut with the first blade used to cut the cover 240 or a third blade that is different from the first and second blades. The multi-step cutting process may be advantageous because the cover 240, spacer 230, and plate 1310 can be cut with relatively thick blades that produce a large gap, and then the substrate 212 can be cut with a relatively thin blade to mitigate the kerf through the substrate 212.

Several embodiments of the method illustrated in FIGS. 13A-13D can precisely shape the substrate 212 to impart the desired curvature or other shape to the image sensors 221. For example, because the shaped surfaces can be formed to precise contours using molding, etching, embossing or other processes, the backing member 1300 provides precise molding units to shape the image sensors 221. This is expected to further enhance the ability to use curved image sensors in microelectronic imager devices.

Several embodiments of the method illustrated in FIGS. 13A-13D are also expected to provide high throughput and low cost processes for forming curved image sensors. First, because the image sensors 221 can be shaped at the wafer level, all of the image sensors can be processed at least substantially simultaneously to enhance the throughput of the method. Second, the backing member 1300 is relatively inexpensive to form using (a) known molding or embossing processes to form the shaped surfaces 1322, and (b) known mechanical or laser processes to form the openings 1324. Therefore, the processes illustrated in FIGS. 13A-D provide inexpensive, high throughput procedures for manufacturing microelectronic imager devices.

Figure 14A:
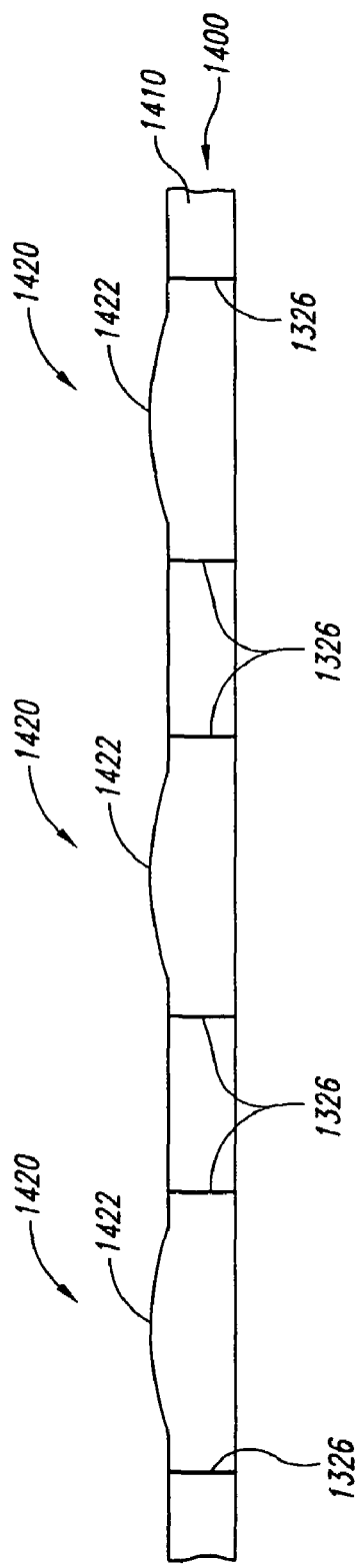
FIGS. 14A and 14B are cross-sectional views illustrating stages of a process for fabricating microelectronic imager devices with curved image sensors in accordance with another embodiment of the invention.
Figure 14B:
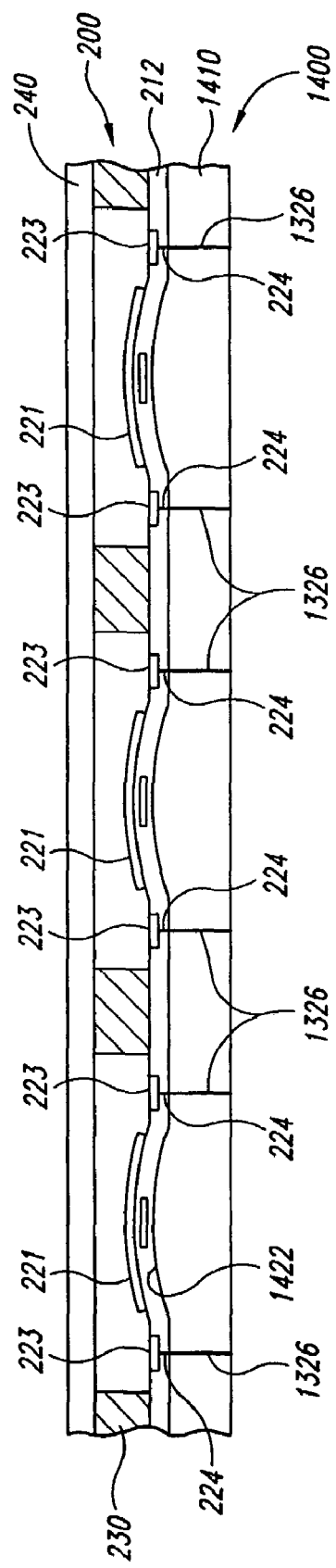

FIGS. 14A and 14B are cross-sectional views illustrating another embodiment for forming microelectronic imager devices in accordance with the invention. FIG. 14A illustrates a different embodiment of a backing member 1400 having a plate 1410 and a plurality of shaped surfaces 1422 defined by raised or curved convex areas along the plate 1410. The backing member 1400 can further include a plurality of interconnects 1326 as described above with reference to FIG. 13A. FIG. 14B illustrates a subsequent stage of this method in which the assembly 200 has been attached to the backing member 1400 such that the image sensors 221 are aligned with corresponding shaped surfaces 1422. In this embodiment, the convex shaped surfaces 1422 bend the image sensors 221 toward the cover 240. The assembly 200 can be adhered to the backing member 1400 with an adhesive, and the assembled workpiece can be cut to separate individual microelectronic imager devices from one another as explained above.

Figure 15:
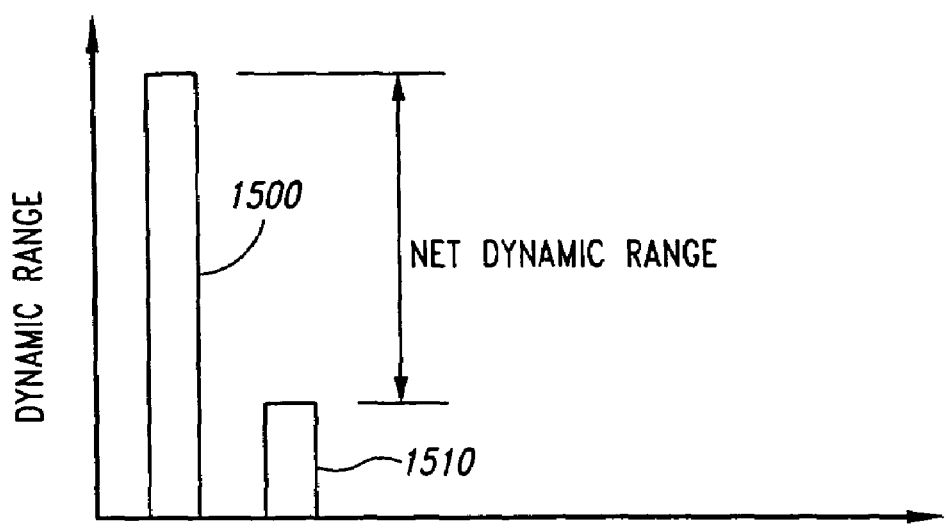
FIG. 15 is a graph illustrating dark current effects on microelectronic imager devices.

One concern of bending the substrate 212 to form curved image sensors is that the curvature of the image sensors should be selected to avoid excessive "dark current" that may affect the performance of the devices. Dark current in an image sensor is the background electrical current in the device when no radiation is present. In the case of an image sensor that detects radiation in the visible spectrum, it is the background electrical current in the device when it is dark (i.e., no light is present). Dark current can be caused by defects in the silicon crystal (e.g., the epitaxial layer), and bending the substrate stresses the epitaxial layer and may produce defects. FIG. 15 is a graph illustrating the potential need to mitigate the extent of dark current. More specifically, FIG. 15 is a bar graph in which a first bar 1500 illustrates the actual signal strength of light impinging upon an image sensor and a second bar 1510 illustrates the dark current signal. The net dynamic range is a difference between the actual signal strength 1500 and the dark current signal 1510. To obtain an adequate net dynamic range for an image sensor, the dark current signal 1510 should be limited to avoid excessive noise.

Figure 16:
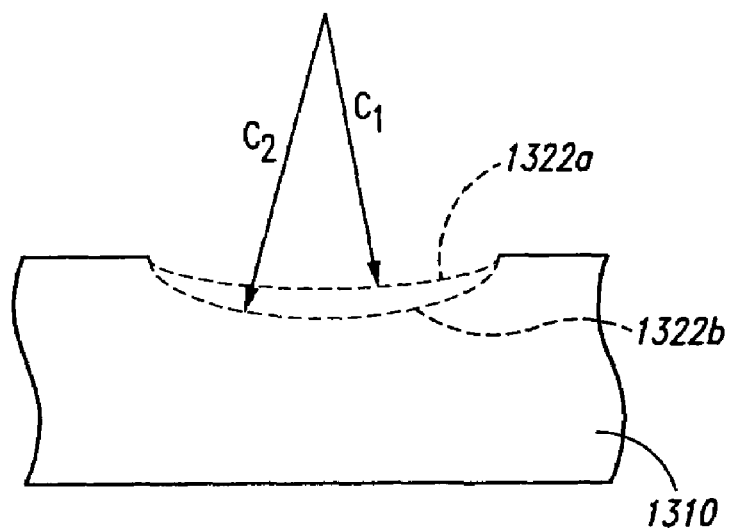
FIG. 16 is a cross-sectional view illustrating an aspect of forming curved image sensors in accordance with an embodiment of the invention.

Several embodiments of the curved image sensors described above with reference to FIGS. 2-14B may be shaped to mitigate the extent of dark current. FIG. 16 is a partial cross-sectional view of the plate 1310 described above with reference to FIG. 13A. In this embodiment, the plate 1310 is configured to limit the curvature of the substrate 212 to an amount that does not produce excessive dark current and/or excessive non-uniformities in the dark current. To accomplish this, the shaped surfaces in the plate 1310 have precise curvatures that may be specifically selected according to the type of image sensor. For example, high definition cameras have relatively low tolerances for dark current such that a shaped surface 1322a may have a shallow or relatively large radius of curvature $C_1$ to limit the curvature of the image sensor. Conversely, temperature sensors or other sensors have higher tolerances such that a shaped surface 1322b may have a deeper or relatively smaller radius of curvature $C_2$. It will be appreciated that the difference between the curvatures $C_1$ and $C_2$ in FIG. 16 are exaggerated for purposes of illustration.

From the foregoing, it will be appreciated that specific embodiments of the invention have been described herein for purposes of illustration, but that various modifications may be made without deviating from the spirit and scope of the invention. For example, the substrate 212 can have patterns of trenches or other voids etched on the front side 214 and/or the backside 216 to preferentially direct the flexure of the substrate 212 using any of the embodiments described above with respect to FIGS. 5-14B. Similarly, ridges or other protrusions can be formed on the substrate 212 in lieu of or in addition to voids to preferentially direct the flexure of the substrate. Also, aspects of the invention described in the particular embodiments may be combined with each other or eliminated in other embodiments. Accordingly, the invention is not limited except as by the appended claims.

We claim:

1. A microelectronic imager device, comprising:
   an imaging die comprising:
      a substrate having a front side and a backside,
      a microelectronic image sensor comprising a face located at the front side of the substrate, and
      integrated circuitry connected to the image sensor; and
   a flexor unit comprising a backing member that includes a shaped surface with a non-planar contour,
   wherein at least a portion of the backside of the substrate is attached to and conforms with the shaped surface of the backing member such that the face of the microelectronic image sensor is curved.

2. The microelectronic imager device of claim 1 wherein the imaging die further comprises backside interconnects electrically coupled to the integrated circuitry and the backing member further comprises interconnects electrically coupled to the backside interconnects.

3. The microelectronic imager device of claim 1 wherein the shaped surface comprises a curved surface having a radius of curvature configured to limit dark current in the image sensor.

4. The microelectronic imager device of claim 1, further comprising a standoff attached to the front side of the substrate and a cover attached to the standoff.

5. The microelectronic imager device of claim 1 wherein the shaped surface comprises a curved depression in the backing member and the backing member further comprises an opening in the depression to form a vacuum cup, and wherein the substrate conforms to the vacuum cup.

6. A microelectronic imager device assembly, comprising:
   a substrate comprising a front side, a backside, and a plurality of imaging dies arranged in a die pattern, wherein the imaging dies further comprise microelectronic image sensors located at the front side of the substrate and integrated circuitry electrically coupled to the image sensors; and
   a backing member comprising a plurality of curved surfaces arranged in the die pattern, wherein individual curved surfaces are aligned with respective microelectronic image sensors and attached to the backside of the substrate,
   wherein the substrate conforms to the plurality of curved surfaces such that each of the plurality of microelectronic image sensors has a curvature corresponding to the curvature of a respective one of the curved surfaces.

7. The microelectronic imager device assembly of claim 6 wherein the microelectronic imaging dies further comprise backside interconnects electrically coupled to the integrated circuitry and the backing member further comprises interconnects electrically coupled to the backside interconnects of the imaging dies.

8. The microelectronic imager device assembly of claim 6 wherein the curved surfaces have a radius of curvature configured to limit dark current in the image sensor.

9. The microelectronic imager device of claim 6, further comprising standoffs attached to the front side of the substrate and a cover attached to the standoffs.

10. The microelectronic imager device of claim 6 wherein the curved surfaces comprise depressions in the backing member and the backing member further comprises one or more openings in the depressions to form vacuum cups, and wherein the substrate conforms to the vacuum cups.

11. A method of manufacturing microelectronic imager devices, comprising:
providing a substrate comprising a front side, a backside and a plurality of imaging dies arranged in a die pattern, wherein the imaging dies comprise microelectronic image sensors located at the front side of the substrate and integrated circuitry electrically coupled to the image sensors;
providing a backing member comprising a plurality of curved surfaces arranged in the die pattern; and
attaching the backing member to the backside of the substrate such that individual ones of the plurality of curved surfaces are aligned with respective microelectronic image sensors and such that the substrate conforms to the plurality of curved surfaces such that each of the plurality of microelectronic image sensors has a curvature corresponding to the curvature of a respective one of the curved surfaces.

12. The method of claim 11 wherein the curved surfaces are depressions having a curvature corresponding to a desired curvature for the microelectronic image sensors, and wherein attaching the backing member to the backside of the substrate comprises locally bending the substrate until the backside of the substrate conforms to the depressions.

13. The method of claim 11 wherein the curved surfaces define cups and the backing member further comprises openings aligned with the cups, and wherein attaching the backing member to the backside of the substrate comprises drawing a vacuum through the openings that draws the backside of the substrate into the cups.

14. The method of claim 13, further comprising adhering the backside of the substrate to the curved surfaces.

15. The method of claim 11 wherein:
the substrate further comprises backside interconnects electrically coupled to the integrated circuitry;
the backing member further comprises interconnects; and
attaching the backing member to the backside of the substrate further comprises electrically coupling the backside interconnects of the substrate with the interconnects of the backing member.

16. The method of claim 11, further comprising separate the imaging dies from each other by cuffing the substrate and the backing member after attaching the backing member to the backside of the substrate.

17. The method of claim 11, further comprising:
forming standoffs on the front side of the substrate;
attaching a cover to the standoffs; and
separating the imaging dies from each other by cutting the cover, the substrate and the backing member.

18. The method of claim 11 wherein the curved surfaces are depressions.

19. The method of claim 11 wherein the curved surfaces are raised features.

* * * * *